United States Patent
Sekiya

[11] Patent Number: 5,272,035
[45] Date of Patent: Dec. 21, 1993

[54] PHOTOSENSITIVE LITHOGRAPHIC PRINTING PLATE HAVING TREATED ALUMINUM SUPPORT WITH DIAZONIUM LIGHT-SENSITIVE LAYER CONTAINING POLYURETHANE RESIN AND PHOSPHOROUS ADDITIVE

[75] Inventor: Toshiyuki Sekiya, Shizuoka, Japan

[73] Assignee: Fuji Photo Film Co., Ltd., Kanagawa, Japan

[21] Appl. No.: 700,435

[22] Filed: May 15, 1991

[30] Foreign Application Priority Data

May 21, 1990 [JP] Japan .................. 2-130857

[51] Int. Cl.$^5$ .................. G03F 7/09; G03F 7/021
[52] U.S. Cl. .................. 430/157; 430/175; 430/176; 430/177; 430/278; 430/302
[58] Field of Search .......... 430/157, 175, 176, 177, 430/278, 302

[56] References Cited

U.S. PATENT DOCUMENTS

| | | | |
|---|---|---|---|
| 3,404,003 | 10/1968 | Steppan | 430/157 |
| 4,877,711 | 10/1989 | Aoai et al. | 430/175 |
| 4,937,170 | 6/1990 | Mohr | 430/175 |
| 4,980,263 | 12/1990 | Sekiya | 430/175 |

Primary Examiner—Charles L. Bowers, Jr.
Assistant Examiner—Christopher G. Young
Attorney, Agent, or Firm—Burns, Doane, Swecker & Mathis

[57] ABSTRACT

A light-sensitive composition comprising (a) a diazonium compound, (b) a polyurethane resin having a substituent group with an acidic hydrogen atom, and (c) a compound of the following general formula:

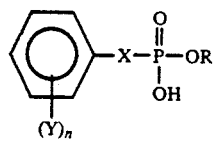

wherein X is a single bond, —O—, —CH$_2$—, or —CH$_2$O—; Y is an alkyl group, a hydroxy group, an alkoxy group, a nitro group or a halogen atom; n is an interger of from 0 to 5; R is a hydrogen atom, an alkyl group, a phenyl group or a substituted phenyl group; and wherein, when n≧2, Y may be the same or different.

Also disclosed is a photosensitive lithographic printing plate having a support and a light-sensitive layer deposited thereon. The light-sensitive layer comprises the above novel light-sensitive composition.

19 Claims, No Drawings

PHOTOSENSITIVE LITHOGRAPHIC PRINTING PLATE HAVING TREATED ALUMINUM SUPPORT WITH DIAZONIUM LIGHT-SENSITIVE LAYER CONTAINING POLYURETHANE RESIN AND PHOSPHOROUS ADDITIVE

BACKGROUND OF THE INVENTION

The present invention relates to a negative working light-sensitive composition, and particularly to a light-sensitive composition which is suitably used in a photosensitive lithographic printing plate having excellent developability in aqueous alkali developers, excellent printing durability and excellent film strength in image areas during development. The present invention also relates to a photosensitive lithographic printing plate having the novel light-sensitive composition applied thereto.

The vast majority of light-sensitive substances used for imparting light sensitivity to negative-forming printing materials are diazonium compounds. The most commonly used are diazonium resins, of which the condensation product of p-diazdiphenylamine and formaldehyde is representative.

The composition of the light-sensitive layers of photosensitive lithographic printing plates using diazo resins can be classified into two groups: (1) those containing diazo resins is without binders, as in U.S. Pat. No. 2,714,066, and (2) those containing mixtures of diazo resins and binders as in Japanese Unexamined Patent Publication (hereinafter Kokai) No. Sho 50-30604(=U.S. Pat. No. 4,275,138). However, in recent years, most light-sensitive lithographic printing plates using diazonium compounds have come to use diazonium compounds and polymer binders in order to impart high printing durability.

Such light-sensitive layers, as described in U.S. Pat. No. 4,123,276, can be of the so-called alkali developing type in which the unexposed areas are removed by means of an aqueous alkali developer, or of the so-called solvent developing type in which the unexposed areas are removed by an organic solvent type developer. However, from the viewpoint of labor health and safety, alkali developing types are given attention. Binders for use in such alkali developing type light-sensitive layers can be copolymers of 2-hydroxyethyl (meth)acrylate and carboxylic acid-containing monomers such as methacrylic acid as disclosed in the above-mentioned U.S. Pat. No. 4,123,276; copolymers of aromatic hydroxy group-containing monomers and carboxylic acid-containing monomers such as methacrylic acid as described in Japanese Kokai No. Sho 57-43890; polymers made by reacting the carboxylic acid portion formed by the reaction of the remaining OH groups of polyvinyl acetal resin and an acid anhydride with a halogenated compound having a hydroxy group or an amino group as described in U.S. Pat. No. 4,741,985; or polymers made by reacting sulfonyl isocyanate with a polymer having free OH groups as disclosed in Japanese Kokai No. Sho 47- 9902 (=U.S. Pat. No. 3,732,105). However, none of the above binders are sufficiently satisfactory.

Japanese Kokai No. Sho 63-113450 (=U.S. Pat. No. 4,877,711) discloses a polyurethane resin having a substituent group with an acidic hydrogen, which represents a great improvement in abrasion resistance, but much further improvements are desirable.

In U.S. Pat. No. 3,404,003, a diazonium compound-containing light-sensitive composition layer is proposed having an organic phosphonate other than polyvinyl phosphonate. However, this type of layer does not have the resin of high abrasion resistance as used in the present invention and therefore can not be expected to have sufficient effectiveness.

SUMMARY OF THE INVENTION

It is an object of the present invention to offer a light-sensitive composition which imparts far superior developability in aqueous alkali developers, superior film strength of the image areas during development, and superior printing durability to a light-sensitive lithographic printing plate.

In accordance with the above object, the present invention provides a light-sensitive composition comprising (a) a diazonium compound, (b) a polyurethane resin having a substituent group with an acidic hydrogen atom, and (c) a compound of the following general formula:

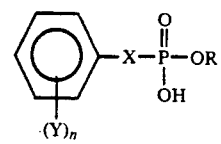

wherein X is a single bond, —O—, —CH$_2$—, or —CH$_2$O—; Y is an alkyl group, a hydroxy group, an alkoxy group, a nitro group, or a halogen atom; n is an interger of from 0 to 5; R is a hydrogen atom, an alkyl group, a phenyl group, or a substituted phenyl group; and wherein, when n≧2, Y may be the same or different.

Another embodiment of the present invention provides a photosensitive lithographic printing plate comprising a support and a light-sensitive layer including the novel light sensitive composition.

Further objects, features and advantages of the present invention will become apparent from the Detailed Description of the Preferred Embodiments which follows, when viewed in light of the accompanying Working and Comparative Examples.

DETAILED DESCRIPTION OF THE PREFERRED EMBODIMENTS

The present inventors, as a result of zealous investigation into attaining the above objects, have discovered that the objects can be acheived by a polyurethane resin having a substituent group with an acidic hydrogen atom, wherein the resin has a certain type of additive added thereto.

That is, the present invention is a light-sensitive composition comprising (a) a diazonium compound, (b) a polyurethane resin having a substituent group with an acidic hydrogen atom, and (c) a compound represented by the following general formula:

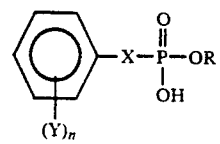

In the formula, X is a single bond, —O—, Y is an alkyl group, a hydroxy group, an alkoxy group, a nitro group, or a halogen atom; n is an integer of from 0 to 5;

R is a hydrogen atom, an alkyl group, a phenyl group, or a substituted phenyl group; and, when $n \geq 2$, Y may be the same or different.

Specific examples of Y that can be named are a methyl group, an ethyl group, an n-propyl group, an isopropyl group, an n-butyl group, an isobutyl group, a tert-butyl group, a sec-butyl group, a hydroxy group, a methoxy group, an ethoxy group, an n-propoxy group, an isopropoxy group, an n-butoxy group, an isobutoxy group, a tert-butoxy group, a sec-butoxy group, a nitro group, a fluorine atom, a chlorine atom, a bromine atom, and an iodine atom. Specific examples of R that can be named are a hydrogen atom, a methyl group, an ethyl group, an n-propyl group, an isopropyl group, an n-butyl group, an isobutyl group, a tert-butyl group, a sec-butyl group, a phenyl group, a fluorophenyl group, a chlorophenyl group, a bromophenyl group, and a tolyl group.

Specific examples of the compound represented by the above general formula used in the present invention are phenyl phosponic acid, methyl phenyl phosphonate, ethyl phenyl phosphonate, propyl phenyl phosphonate, butyl phenyl phosphonate, nitrophenyl phosphonic acid, chlorophenyl phosponic acid, dichlorophenyl phosphonic acid, tolyl phosphonic acid, phenyl Phosphoric acid, methyl phenyl phosphate, benzyl phosphonic acid, phenyl benzyl phosphonate, fluorobenzyl phosphonic acid, chlorobenzyl phosphonic acid, bromobenzyl phosphonic acid, nitrobenzyl phosphonic acid, benzyl phosphate, nitrobenzyl phosphate, chlorobenzyl phosphate, bromobenzyl phosphate, and fluorobenzyl phosphate. Particularly preferred are phenyl phosphonic acid and benzyl phosphonic acid. The proportion of the compound represented by the above general formula in the light-sensitive composition is, with respect to the diazonium compound, 0.1-50% by weight, preferably 0.5-30% by weight. If the compound is applied to a printing plate in an amount less than 0.1% by weight, the film strength of the image areas during development and the printing durability are not sufficient, and if more than 50% by weight is applied, the developability suffers.

The polyurethane resin used in the present invention has a substituent group with an acidic hydrogen atom. Such kinds of substituent groups with acidic hydrogen atoms are those groups which have an acid dissociation constant (pKa) in water of less than 7, and they include for example, —COOH, —SO$_2$NHCOO—, —CONHSO$_2$—, —CONHSO$_2$NH—, and —NHCONHSO$_2$—. Particularly preferred is —COOH. The amount of acid contained per gram of polyurethane resin is preferably 0.05-6 milliequivalents. If there are less than 0.05 milliequivalents, then the developability in the developer is insufficient, and if more than 6 milliequivalents, the abrasion resistance becomes inferior. More preferably there are 0.2-4 milliequivalents.

The above polyurethane resin can be made according to various methods. For example, a preferred polyurethane resin having a carboxyl group as the substituent group with an acidic hydrogen can be a resin with a backbone formed by the reaction of the diisocyanate compound represent by general formula (I), and the diol compound with a carboxyl group represented by general formula (II), (III) or (IV).

$$OCN-R^1-NCO \quad (I)$$

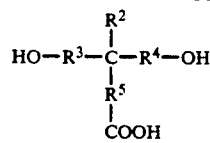

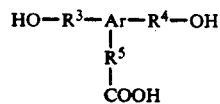

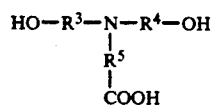

In the formulas, $R^1$ is either a substituted, divalent aliphatic or substituted, divalent aromatic hydrocarbon (the preferred substituents are for example alkyl, alkenyl, aralkyl, aryl, alkoxy and halogen). If necessary, there may be another functional group in $R^1$ which does not react with the isocyanate group, for example, ester, urethane, amide, and ureide and a carbon-carbon unsaturated bond.

$R^2$ is a hydrogen atom, a substituted or unsubstituted alkyl, alkenyl, aralkyl, aryl, alkoxy, or aryloxy. Preferrable substituents are for example alkyl, aryl, alkoxy, ester, urethane, amide, ureide and halogen. $R^2$ is preferably a hydrogen atom, an alkyl having 1-8 carbon atoms, an alkenyl having 2-8 carbon atoms, or an aryl having 6-15 carbon atoms.

$R^3$, $R^4$ and $R^5$ may be the same or different and each may represent a single bond, a substituted or unsubstituted, divalent, aliphatic or aromatic hydrocarbon (the preferred substituents are alkyl, alkenyl, aralkyl, aryl, alkoxy and halogen). $R^3$, $R^4$, and $R^5$ are preferably an alkylene having 1-20 carbon atoms, an arylene having 6-15 carbon atoms, and more preferably an alkylene having 1-8 carbon atoms. To the extent necessary, $R^3$, $R^4$, and $R^5$ may contain another functional group which does not react with the isocyanate group, for example, ester group, urethane, amide, ureide or a carbon-carbon unsaturated bond. Furthermore, two or three of $R^2$, $R^3$, $R^4$, and $R^5$ may form a ring.

Ar is a substituted or unsubstituted, trivalent, aromatic hydrocarbon, preferably an aromatic group having 6-15 carbon atoms.

The following specifically-recited compounds are included within the scope of the isocyanate compound indicated by general formula (I): aromatic diisocyanate compounds such as 2,4-tolylene diisocyanate, 2,4-tolylene diisocyanate dimer, 2,6-tolylene diisocyanate, p-xylylene diisocyanate, m-xylelene diisocyanate, 4,4'-diphenylmethane diisocyanate, 1,5-napthalene diisocyanate, 3,3'-dimethyl biphenyl-4,4'-diisocyanate, and the like; aliphatic diisocyanate compounds such as hexamethylene diisocyanate, trimethyl hexamethylene diisocyanate, lysine diisocyanate, dimer acid diisocyanate and the like; alicylclic diisocyanate compounds such as isophorone diisocyanate, 4,4'-methylene bis(cyclohexylisocyanate), methylcyclohexane-2,4 (or 2,6)-diisocyanate, 1,3-(isocyanate methyl)cyclohexane and the like; and diisocyanate compounds that are the reaction products of diols and diisocyanates, such as the addition product of 1 mole of 1,3-butylene glycol, and 2 moles of tolylene diisocyanate, and the like.

The following specifically-recited compounds are included in the scope of the diol compounds with carboxyl groups indicated by general formula (II), (III) or (IV): 3,5-dihydroxy benzoic acid, 2,2-bis(hydroxymethyl) propionic acid, 2,2 bis(2-hydroxyethyl) propionic acid, 2,2 bis(3-hydroxypropyl) propionic acid, bis(hydroxymethyl) acetic acid, bis(4-hydroxyphenyl) acetic acid, 4,4-bis(4-hydroxyphenyl) pentanoic acid, tartaric acid, N,N-bis(2-hydroxyethyl)-3-carboxy propionamide and the like.

Polyurethane resins having substituents with acidic hydrogen atoms other than carboxyl groups include polyurethane resins having a backbone structure formed by reacting the diisocyanate group of general formula (I) with diol compounds of the below formula (V), (VI), (VII) or (VIII).

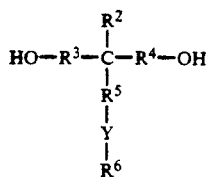 (V)

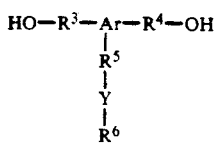 (VI)

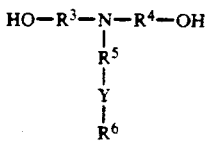 (VII)

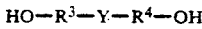 (VIII)

In the formulas, $R^2$, $R^3$, $R^4$, $R^5$ and Ar have the same definitions as above. $R^6$ is a substituted or unsubstituted, monovalent, aliphatic or aromatic hydrocarbon (substituents are preferably, for example alkyl, alkoxy or halogen). $R^6$ is preferably an alkyl group with 1-20 carbon atoms, an alkenyl group having 2-20 carbon atoms, an aryl group having 6-15 carbon atoms or an aralkyl group having 7-15 carbon atoms. More preferably, $R^6$ is an alkyl group having 1-8 carbon atoms, an alkenyl group having 2-8 carbon atoms or an aryl group having 6-10 carbon atoms.

Y indicates an N-sulfonylamide group (—CO—NH—SO$_2$—), an N-sulfonylureide group (—NH—CO—NH—SO$_2$—), an N-amino sulfonylamide group (—CO—NH—SO$_2$—NH—) or a sulfonylurethane group (—O—CO—NH—SO$_2$—).

The diol compounds indicated by general formula (V), (VI), (VII) or (VIII) can be synthesized by reacting, for example, the diol compounds with carboxy groups indicated by general formulas (II), (III), and (IV), after protecting the hydroxy groups, in the presence of a base, with the compounds of general formula (IX), (X), (XI) or (XII). The above diol compounds can also be synthesized by reacting the diol compounds with carboxy groups indicated by general formula (II), (III) or (IV), after protecting the hydroxy groups, with chlorosulfonyl isocyanate, and then reacting the resulting product with the amine compound of general formula (XIII).

 (IX)

 (X)

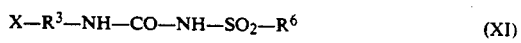 (XI)

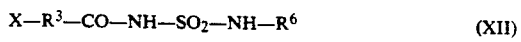 (XII)

 (XIII)

In the formulas, X is a chlorine atom or a bromine atom.

One can react one hydroxy group of the trihydroxy compound with the compound of general formula (IX) to prepare a compound of general formula (V), (VI) or (VII) wherein Y is a sulfonylurethane group.

The compound of general formula (X) can be synthesized by reacting the compounds of the below general formulas (XIV) and (XV). The compound of general formula (XI) can be synthesized by reacting the below compounds of general formula (XVI) and (XV). The compound of general formula (XII) can be synthesized by first reacting the below compound of general formula (XVII) with chlorosulfonyl isocyanate, and then reacting the resultant product with the amine compound of general formula (XIII).

 (XIV)

 (XV)

 (XVI)

 (XVII)

Furthermore, the diol compound of general formula (VIII) can be variously synthesized by hydroxylating the reaction products of, for example, the reaction of compound (XIV) and below compound (XVIII), the reaction of compound d(XVI) and below compound (XVIII), the reaction of first reacting compound (XVIII) with chlorosulfonyl isocyanate and then reacting with below compound (XIX).

 (XVIII)

 (XIX)

The below compounds are included as specific examples of the diol compounds of general formulas (II), (III), (IV) and (V).

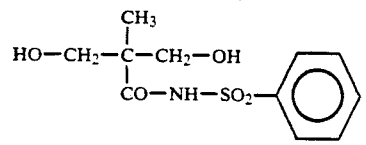 (No. 1)

-continued
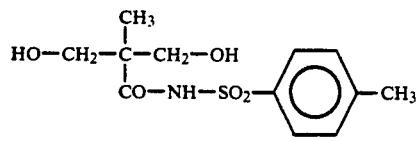 (No. 2)
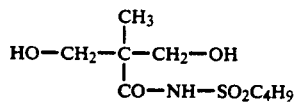 (No. 3)
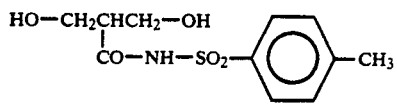 (No. 4)
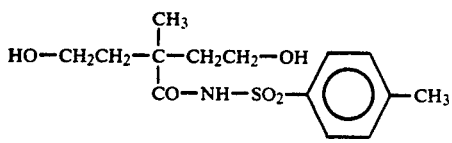 (No. 5)
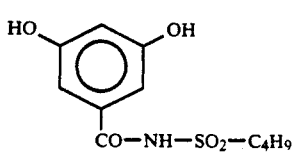 (No. 6)
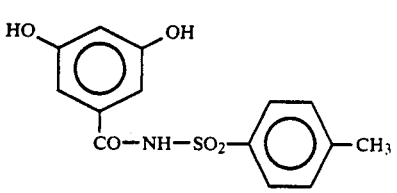 (No. 7)
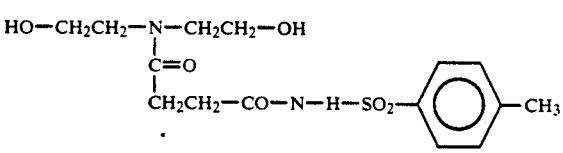 (No. 8)
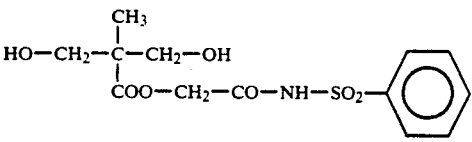 (No. 9)
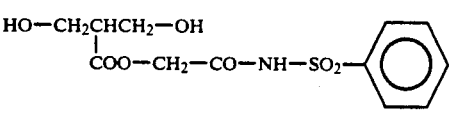 (No. 10)
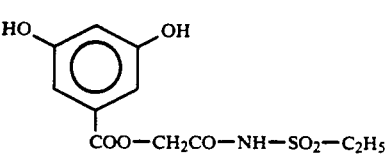 (No. 11)
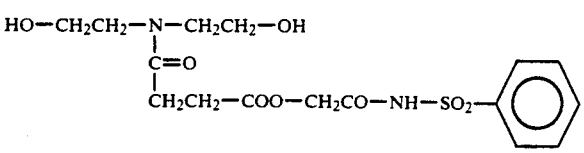 (No. 12)

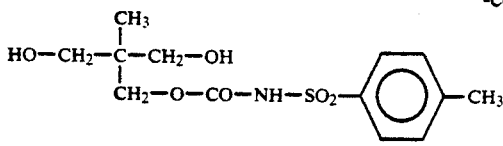 (No. 13)

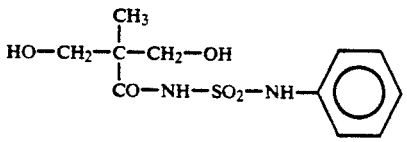 (No. 14)

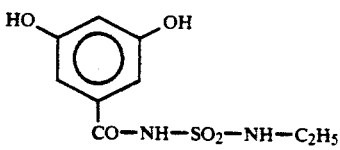 (No. 15)

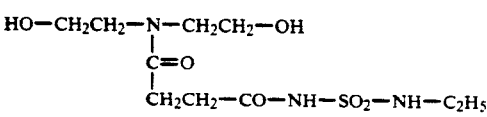 (No. 16)

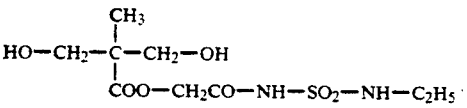 (No. 17)

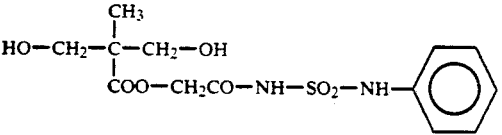 (No. 18)

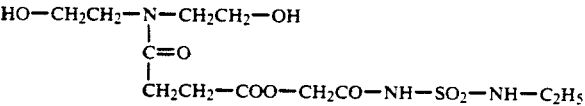 (No. 19)

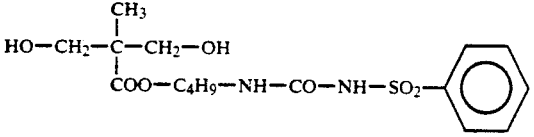 (No. 20)

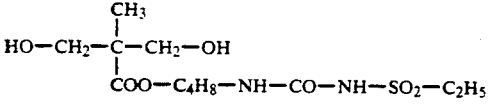 (No. 21)

HO—CH$_2$CO—NH—SO$_2$—C$_3$H$_6$—OH  (No. 22)

HO—CH$_2$CO—NH—SO$_2$—NH—C$_2$H$_4$—OH  (No. 23)

HO—C$_3$H$_6$CO—NH—SO$_2$—NH—C$_2$H$_4$—OH  (No. 24)

The polyurethane resins used in the present invention are synthesized by reacting the diisocyanate compounds of general formula (I) with the diol compounds of general formulas (VI), (VII), or (VIII), to form a polyurethane resin having a carboxyl group, and then reacting the reaction product with a compound of general formula (IX), (X), (XI) or (XII) in the presence of a base catalyst; or, by reacting the above polyurethane resin having a carboxyl group with chlorosulfonyl isocyanate, and then reacting with an amine compound of general formula (XIII).

Furthermore, it is possible to additionally use a diol substituted with another group, not a carboxyl group, and not a group reactive with isocyanate, to the extent that the alkali developability is not reduced.

Specific examples of this kind of diol are given below: ethylene glycol; diethylene glycol; triethylene glycol; tetraethylene glycol; propylene glycol; dipropylene glycol; polyethylene glycol; polypropylene glycol; neopentyl glycol; 1,3-butylene glycol; 1,4-butane diol; 1,5-pentane diol; 1,6-hexane diol; 2-butene-1,4-diol; 2-butyne-1,4-diol, 2,2,4-trimethyl-1,3-pentane diol; 2,2-diethyl-1,3-propane diol; 1,4-bis-β-hydroxyethoxy cyclohexane; cyclohexane diol; cyclohexane dimethanol; tricyclodecane dimethanol; hydrogenated bisphenol A; 2,2-dimethylol malonic acid diethyl ester; bis(2-hydroxyethyl) sulfide; hydrogenated bisphenol F; the adduct of bisphenol A and ethylene oxide; the adduct of bisphenol A and propylene oxide; the adduct of bisphenol F and ethylene oxide; the adduct of bisphenol F and propylene oxide; the adduct of hydrogenated bisphenol A and ethylene oxide; the adduct of hydrogenated bisphenol A and propylene oxide; hydroquinone dihydroxyethyl ether; p-xylylene glycol; dihydoxyethyl sulphone; bis(2-hydroxyethyl)-2,4-tolylene dicarbamate; 2,4-tolylene-bis(2-hydroxyethyl carbamide), bis(2-hydroxyethyl)-m-xylylene dicarbamate; and bis(2-hydroxyethyl) isophthalate.

In the polyurethane resin used in the present invention, one can introduce a substituent having an acidic hydrogen atom, namely —SO,NHCOO—, by reacting a residual —OH group with the compound of general formula (IX).

The polyurethane resins of the present invention are synthesized by reacting the above diisocyanate compounds and diol compounds with heating in an aprotic solvent to which various known catalysts are added. The activities of the catalysts depends on the reactivity of the above diisocyanate compounds and diol compounds. The catalysts can be, for example, diethylaniline, 2,2,2-diazobicyclooctane and n-dibutyl tin laurate. The molar ratio used between the diisocyanate and diol compounds is preferably 0.8:1–1.2:1. If a terminal isocyanate remains, the polymer is treated with an alcohol or an amine so that no isocyanate remains.

An average molecular weight of the polyurethane resin used in the present invention is preferably more than 1000, more preferably in the range of from 5,000–150,000.

These polyurethane resins may be used alone or in admixture. When incorporated into a light-sensitive layer; the weight of polyurethane resin present is greater than 50% by weight, preferably 50–95% by weight, and more preferably about 60–90% by weight.

The light-sensitive layer according to the present invention may contain another polymer in an amount of less than 50% by weight based on the weight of the polyurethane resin. The mixed-in polymer can be, for example, a polyamide resin, an epoxy resin, a polyacetal resin, an acrylic resin, a methacrylic resin, a polystyrene type resin, or a novolac type phenol resin.

One can name as diazonium compounds used in the present invention the dizonium compounds described in U.S. Pat. No. 3,867,147, and the diazonium compounds described in U.S. Pat. No. 2,632,703. Particularly representative, useful diazo resins are the condensation products of aromatic diazonium salts and, for example, compounds containing active carbonyl groups (for example, formaldehyde). Preferred diazo resins include, for example, the hexafluoro phosphates or tetrafluoro borates of the condensation products of p-diazodiphenylamine and formaldehyde or acetaldehyde. Also preferred are the various salts of the condensation products of p-diazodiphenylamine and formaldehyde, as described in U.S. Pat. No. 3,300,309, such as sulfonates (p-toluene sulfonate, dodecylbenzene sulfonate and 2-methoxy-4-hydroxy-5-benzoylbenzene sulfonate, etc.), phosphinates (benzene phosphinate, etc.), hydroxy group-containing compound salts (2,4-hydroxy benzophenone salt, etc.), and organic carboxylates, etc.

Other appropriate diazocompounds are the mesitylene sulfonate of the condesation product of 3-methoxy-4-diazodiphenyl amine and 4,4'-bis-methoxy-methyl-diphenyl ether and the like disclosed in Japanese Kokii 58-27141. In addition, one can also use diazo resins like those disclosed in Japanese Kokai Nos. Hei 1-102456, Hei 1-102457, Hei 1-254949, Hei 1-255246, and Hei 2-66.

An amount of these diazo compounds in the light-sensitive layer is 1–50% by weight, preferably 3–20% by weight. If necessary, one can use a mixture of two or more diazonium compounds.

One can add various additives to the light-sensitive composition of the present invention.

Examples of such additives are alkyl ethers for improving applicability (for example, ethyl cellulose and methyl cellulose); surfactants (for example, fluorine atom-containing surfactants as described in U.S. Pat. Nos. 3,787,351; 3,790,382; 4,504,567 and 4,822,713); plastic materials for improving the flexibility and abrasion resistance of the film (for example, tricresyl phosphate, dimethyl phthalate, dibutyl phthalate, trioctyl phosphate, tributyl phosphate, tributyl citrate, polyethylene glycol, polypropylene glycol, etc.); colorants for making the image portion visible after development such as acridine dyes, cyanine dyes, styryl dyes, triphenyl methane dyes, or other pigments like phthalocyanine. Other additives are general substances for stabilizing the diazo resin (phosphoric acid, phosphorous acid, pyrophosphoric acid, oxalic acid, boric acid, p-toluene sulfonic acid, benzene sulfonic acid, p-hydroxybenzene sulfonic acid, 2-methoxy-4-hydroxy-5-benzoylbenzene sulfonic acid, malic acid, tartaric acid, dipicolinic acid, polyacrylic acid and its copolymers, polyvinyl phosphonic acid and its copolymers, polyvinyl sulfonic acid and its copolymers, 5-nitronapthalene-1-phosphonic acid, sodium phenylmethylpyrazolone sulfonate, 2-phosphonobutane-1,2,4-tricarboxylic acid, 1-phosphonobutane-1,2,2-tricarboxylic acid, 1-hydroxyethane-1,1-disulfonic acid, etc.). Hydrophobic substances can be added for improving ink receptivity such as those described in Japanese Kokai Nos. Sho 62-60701 and Sho 63-262642 (=U.S. Pat. No. 4,902,602). The amount of these additives changes depending on the purpose intended, but in general the amount is 0.5–30% by weight of the solids in the light-sensitive layer.

One can make a photosensitive lithographic printing plate (PS plate) by dissolving the light sensitive composition of the present invention in an appropriate organic solvent, and coating the solution to a support having a hydrophilic surface so that the dry coating weight is 0.5–5 g/m$^2$. It is desired that the concentration of solids in the light-sensitive composition at the time of coating be in the range of 1–50% by weight. The coating solvents can be methyl Cellosolve, ethyl Cellosolve, 1-methoxy-2-propanol, methyl Cellosolve acetate, acetone, methyl ethyl ketone, methanol, dimethyl formamide, dimethyl sulfoxide, ethylene dichloride, methyl lactate, ethyl lactate, cyclohexanone, dioxane and tetrahydrofuran. It may also be appropriate to add to the solvent or solvent mixture a small amount of water, toluene, or other solvent which does not dissolve the diazo resin or high molecular compound. The light-sensitive liquid obtained from dissolving the light-sensitive composition in the above solvent is coated and then desirably dried at 50°–150° C. The drying method can consist of first preliminarily drying at a low temperature and then drying at a high temperature, or, depending on an appropriate selection of solvent and concentration, one can directly dry at a high temperature.

On top of the light-sensitive layer made in this manner, one can apply a mat layer such as that described in Japanese Kokai Sho 58-182636 (=U.S. Pat. No. 4,557,994).

The support having the hydrophilic surface on which the light-sensitive composition of the present invention is coated is preferably an aluminium plate that has been subjected to a hydrophilic treatment. Firstly, the the surface is grained by wire brush graining; brush graining by roughening the surface with a nylon brush while pouring over a slurry of abrasive particles; mechanical methods such as ball graining; chemical graining using HF, $AlCl_3$ or HCl as an etchant; electrolytic graining using nitric acid or hydrochloric acid as an electrolyte; or a composite surface roughening method using a composite of the above methods. Thereafter, if necessary, the plate is subjected to an etching treatment with acid or alkali, followed by anodization until a passive state, hard film is formed on the surface of the aluminum. The anodization is conducted in sulfuric acid, phosphoric acid, oxalic acid, boric acid, chromic acid, sulfamic acid or a mixture of the above acids in direct or alternating current. The above kind of passive film in itself makes the aluminum surface hydrophilic, but, if necessary, one can also subject the plate to a silicate treatment (sodium silicate, potassium silicate) such as that described in U.S. Pat. No. 2,714,066 or U.S. Pat. 3,181,461; a potassium fluorozirconate treatment as described in U.S. Pat. No. 2,946,638; a phosphomolybdate treatment as described in U.S. Pat. No. 3,201,247; an alkyl titanate treatment as described in U.K. Patent Specification No. 1,108,559; a polyacrylic acid treatment as described in German Patent No. 1,091,433; a polyvinyl phosphonic acid treatment as described in German Patent No. 1,134,093 or U.K. Patent Specification No. 1,230,447; a phosphonic acid treatment as described in Japanese Examined Patent Application (hereinafter Kokoku) No. Sho 44-6409; a phytic acid treatment as described in U.S. Pat. No. 3,307,951; a undercoating treatment with a complex of a divalent metal and a water-soluble organic high molecular compound as described in Japanese Kokai No. Sho 58-16893 or Japanese Kokai No. 58-18291; or a hydrophilic treatment by coating with a water soluble polymer having a sulfonic acid group as described in Japanese Kokai No. Sho 59-101651. An additional hydrophilic treatment is the silicate electrodeposition described in U.S. Pat. No. 3,658,662.

The PS plate made by coating the light-sensitive coating onto the hydrophilic surface of the support is imagewise exposed to light, the image is developed by a weakly alkaline aqueous developer, and a negative relief image of the original image is obtained.

Appropriate light sources for exposure are carbon arc lamps, mercury lamps, xenon lamps, metal halide lamps, strobes, ultraviolet rays and laser beams, among others. The developer for developing the PS plate having the light-sensitive layer of the present invention can be a weakly alkaline aqueous developer comprising an organic solvent having a solubility in water of less than 10% by weight (benzyl alcohol, ethylene glycol monophenyl ether, etc.), an alkali (triethanolamine, monoethanolamine, etc.), an anionic surfactant (an aromatic sulfonate, dialkyl sulfosuccinate, alkyl napthalene sulfonate, a branched alkyl sulfonate salt of the following formula:

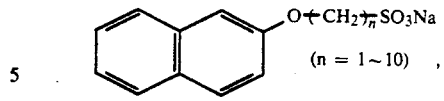

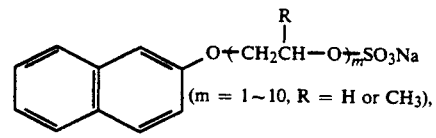

among other surfactants), and water. If necessary, one can also add to the developer an anti-scumming agent (sodium sulfite, the sodium salt of sulfopyrazolone, etc.), or a water softening agent (ethylenediamine tetraacetate 4 Na, N—$(CH_2COONa)_3$, etc.).

Preferred developers are described in Japanese Kokai Nos. Sho 51-77401, Sho 51-80228, Sho 53-44202 (U.S. Pat. No. 4,186,006), and Sho 55-52054.

WORKING EXAMPLES

The present invention is explained in further detail by the following, non-limiting, Working Examples.

SYNTHETIC EXAMPLE 1

To a 500 ml three-necked flask equipped with a stirrer and an condenser, 11.5 g (0.0680 mole) of 2,2-bis(hydroxymethyl) propionic acid, 7.26 g (0.0684 mole) of diethylene glycol, and 4.11 g (0.0456 mole) of 1,4-butane diol were added and dissolved in 118 g of N,N-dimethyl acetamide. To the resulting solution was added 30.8 g (0.123 mole) of 4,4'-diphenylmethane diisocyanate, 13.8 g (0.0818 mole) of hexamethylene diisocyanate, and, as a catalyst, 0.1 g of di-n-butyl tin laurate. The resulting reaction mixture was stirred at 90° C. with heating for 7 hours. Thereafter, 100 ml N,N-dimethyl acetamide, 50 ml methanol and 50 ml acetic acid were added to the reaction mixture, and, after the resultant mixture was stirred, the mixture was thrown into 4 l of water under stirring, and a white polymer separated out. After the polymer was filtered, rinsed with water, and dried under reduced pressure, 62 g of polymer (polyurethane (a) of the present invention) was obtained.

When the molecular weight was measured by gel permeation chromatography (GPC), the average molecular weight was determined to be 70,000 (polystyrene standard). The number of carboxy groups was determined by titration to be 1.12 meq/g.

WORKING EXAMPLES 1-5 AND COMPARATIVE EXAMPLE 1

Firstly, the surface of a 0.3 mm thick aluminum plate was grained by using a nylon brush and an aqueous suspension of 400 mesh pumice stone, then the plate was well rinsed with water. The plate was then etched by immersion in a 10% aqueous sodium hydroxide solution, and, after washing with running water, was neutralized with 20% nitric acid. Using a $V_A=12.7$ V, $V_C=9.1$ square-shaped sinusoidal electric current, an electrolytic roughening treatment was carried out in 1% aqueous nitric acid at an anodic current of 160 coulomb/$dm^2$. The aluminum plate was then treated with a 10% aqueous sodium hydroxide solution until the amount of aluminum dissolved was 1.2 g/$m^2$. Immediately thereafter, the plate was immersed in a 30% aqueous sulfuric acid solution and desmutted at 55° C. for 2 minutes. After desmutting, an anodization treatment was carried out in a 7% aqueous sulfuric acid solution until the amount of the aluminum oxide coating reached 2.5 g/m². Thereafter, the plate was treated by immersing it in a 3% aqueous sodium silicate solution for one minute at 70° C., rinsed with water and dried.

Aluminum plates as above were coated with a light-sensitive solution of the following composition so that the dry weight of the light-sensitive layer was 2.0 g/m², after drying, light-sensitive lithographic plates A-F were obtained.

| Light-sensitive solution: | |
| --- | --- |
| Polyurethane (a) of Synthetic Example 1 | 5 g |
| Dodecyl benzene sulfonate of the condensation product of 4-diazodiphenylamine and formaldehyde | 0.5 g |
| Dye-2 of Working Example 2 of Japanese Kokai No. Sho 63-127235 (1-naphthalene sulfonate of Victoria Blue (a triarylmethane type basic dye)) | 0.1 g |
| Component (c) of the present invention (Table 1) | 0.1 g |
| Fluorad FC-430 (a fluorine atom-containing surfactant made by 3M Corporation of the U.S.) | 0.02 g |
| 1-methoxy-2-propanol | 40 g |
| methyl alcohol | 30 g |
| methyl ethyl ketone | 30 g |
| Surfactant (Surflon S-112: Asahi Glass K.K., 15% aqueous suspension) | 0.15 g |

The photosensitive lithographic printing plates A-F were imagewise exposed to light for one minute at a distance of 1 m with a PS Light (made by Fuji Photo Film Co., Ltd.). When the plates were immersed in an aqueous alkali developer DN-3C (made by Fuji Photo Film Co., Ltd.) (diluted with water in a volume ratio of 1:1) for three minutes and brushed, although each of the plates produced a beautiful image, differences in the defects are indicated in Table 1.

After imagewise exposure to light, using the above, diluted developer and a gum solution FN-2 (made by Fuji Photo Film Co., Ltd.) (diluted with water in a volume ratio of 1:1) in an automatic developing machine (made by Fuji Photo Film Co., Ltd.), the lithographic printing plates thus made were tested for printing durability on a Heidelberg GTO printing press. The resultant number of good printed sheets is indicated in Table 1.

TABLE 1

| Ex. | PS plates | Component (c) | Film strength | Printing durability |
| --- | --- | --- | --- | --- |
| 1 | A | phenyl phosphonic acid | essentially no defects | 150,000 |
| 2 | B | benzyl phosphonic acid | essentially no defects | 140,000 |
| 3 | C | phenyl phosphoric acid | some defects | 120,000 |
| 4 | D | methyl phenylphosphonate | some defects | 120,000 |
| 5 | E | chlorobenzyl phosphonic acid | some defects | 120,000 |
| 1* | F | none | a fair amount of defects | 100,000 |

*Comparative Example

SYNTHETIC EXAMPLE 2

Into a 500 ml three-necked flask equipped with a condenser was added 75 g (0.3 mole) of 4,4'-diphenylmethane diisocyanate, 33.6 g (0.2 mole) of 1,6-hexamethylene diisocyanate, and 67 g (0.5 mole) of 2,2-bis(hydroxymethyl) propionic acid, and the lot was dissolved in 290 ml dioxane. To the above solution, 1 g of N,N-diethyl aniline was added as a catalyst, and the resultant mixture was stirred and refluxed for 6 hours with heating. Thereafter, the reaction liquid was thrown into 4 l of water containing 40 ml of acetic acid while stirring, and a white polymer separated. This polymer was filtered out, rinsed with water and 158 g were obtained after drying in a vacuum.

When the molecular weight was measured with gel permeation chromatography, the average molecular weight was determined to be 45,000 (polystyrene standard). The amount of carboxyl groups was determined by titration to be 2.80 meq/g.

Afterwards, 40 g of this polymer was put into a 300 ml three-necked flask equipped with a condenser and a stirrer and dissolved in 200 ml of dimethyl formamide (DMF). To this solution was added 6.46 g (0.064 mole) triethylamine, and, after heating to 80° C., 8.0 g (0.064 mole) of ethylene bromohydrin was dropped in under stirring over a period of 10 minutes. Thereafter stirring was continued for 2 hours.

After the reaction was completed, the reaction liquid was thrown into 4 l of water having 200 ml of acetic acid dissolved therein under stirring and a white polymer separated. This polymer was separated by filtration, rinsed with water, and after drying in a vacuum 42 g of polymer was obtained.

By means of NMR measurements, it was confirmed that the hydroxyethyl groups were introduced into the carboxy groups. Furthermore, the amount of remaining carboxyl groups was determined by titration to be 1.21 meq/g (polyurethane (b) of the invention).

WORKING EXAMPLES 6-9 AND COMPARATIVE EXAMPLE 2

Using the same plates as in Working Example 1, and by the same method as Working Example 1, the light-sensitive solution of the below composition was coated onto the plates to prepare a light-sensitive layer with a dry weight of 1.8 g/m², and, after drying, photosensitive lithographic printing plates G-K were obtained.

| Light sensitive solution: | |
| --- | --- |
| Polyurethane (b) of Synthetic Example 2 | 5 g |
| Dodecylbenzene sulfonate of the condensation product of 4-diazodiphenylamine and formaldehyde | 0.5 g |
| Victoria Pure Blue-BOH | 0.1 g |
| Component (c) of the invention (Table 2) | 0.05 g |
| Fluororad FC-430 (fluorine atom containing surfactant, 3M Corporation, U.S.A) | 0.01 g |
| Tricresyl phosphate | 0.25 g |
| Pivalic acid ester (esterification rate 83 mol %) of poly-p-hydroxystyrene (average molecular weight 5,000) | 0.1 g |
| 1-methoxy-2-propanol | 40 g |
| ethylene glycol monomethyl ether | 10 g |
| methyl alcohol | 20 g |
| methyl ethyl ketone | 30 g |

The film strength in image portions during development and the printing durability of these photosensitive lithographic printing plates was tested in the same manner as Working Example 1. The results are given in Table 2.

TABLE 2

| Ex. | PS plates | Component (c) | Film strength | Printing durability |
| --- | --- | --- | --- | --- |
| 6 | G | bromophenyl phosphonic acid | some defects | 100,000 |

TABLE 2-continued

| Ex. | PS plates | Component (c) | Film strength | Printing durability |
|---|---|---|---|---|
| 7 | H | fluorobenzyl phosphonic acid | some defects | 100,000 |
| 8 | I | benzyl phosphate | some defects | 100,000 |
| 9 | J | chlorobenzyl phosphate | some defects | 100,000 |
| 2* | K | none | a fair amount of defects | 80,000 |

*Comparative Example

The light-sensitive composition of the present invention endows photosensitive lithographic printing plates with excellent developability in aqueous alkali developers, excellent film strength in the image portions during development and excellent printing durability.

While the present invention has been illustrated by means of several preferred embodiments and Working Examples, one of ordinary skill in the art will of course recognize that modifications and improvements may be made while remaining within the scope and spirit of the present invention. The scope of the present invention is determined soley by the appended claims.

What is claimed is:

1. A photosensitive lithographic printing plate comprising an aluminum support having a light-sensitive layer provided thereon, the surface of said aluminum support having been grained, anodized and then subjected to a silicate treatment with an aqueous solution of sodium silicate or potassium silicate, and said light-sensitive layer including a light-sensitive composition comprising, in admixture, (a) 1 to 50% by weight of a diazonium compound, (b) 50 to 95% by weight of a polyurethane resin having a substituent group with an acidic hydrogen atom, and (c) 0.1 to 50% by weight based on the total weight of component (a) of a compound represented by the following formula:

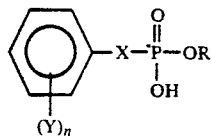

wherein X is a single bond, —O—, —CH$_2$—, or —CH$_2$O—; Y is an alkyl group, a hydroxy group, an alkoxy group, a nitro group or a halogen atom; n is an integer of from 0 to 5; R is a hydrogen atom, an alkyl group, a phenyl group or a substituted phenyl group; and wherein, when n≧2, Y may be the same or different.

2. A printing plate according to claim 1, wherein the amount of component (a) ranges from 3 to 20% by weight based on the total weight of the composition.

3. A printing plate according to claim 1, wherein the amount of component (b) ranges from 60 to 90% by weight based on the total weight of the composition.

4. A printing plate according to claim 1, wherein the amount of component (c) ranges from 0.5 to 30% by weight based on the total weight of the component (a).

5. A light-sensitive composition according to claim 1, wherein the component (a) is an aromatic diazonium salt condensate.

6. A photosensitive lithographic printing plate according to claim 5, wherein said aromatic diazonium salt condensate is a condensation product of an aromatic diazonium salt and a compound containing an active carbonyl group.

7. A photosensitive lithographic printing plate according to claim 6, wherein said condensate is selected from the group consisting of hexafluorophosphate of a condensation product of p-diazodiphenylamine and formaldehyde, a sulfonate of a condensation product of p-diazodiphenylamine and formaldehyde, and a mesitylene sulfonate of a condensation product of 3-methoxy-4-diazodiphenylamine and 4,4'-bismethoxymethyldiphenyl ether.

8. A printing plate according to claim 1, wherein component (b) comprises a substituent group selected from —COOH, —SO$_2$NHCOO—, —CONHSO$_2$—, —CONHSO$_2$NH— and —NHCONHSO$_2$.

9. A printing plate according to claim 1, wherein component (b) comprises a resin with a backbone formed by the reaction of the diisocyanate compound represented by formula (I), and one or more of the diol compounds with carboxyl groups represented by formula (II),(III) or (IV).

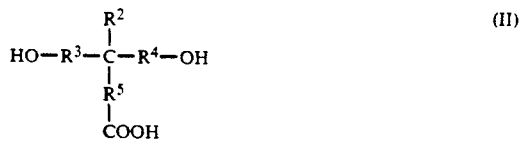

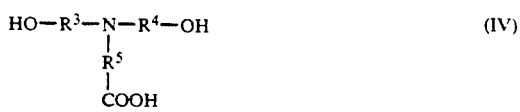

wherein
R$^1$ is a substituted or unsubstituted, divalent aliphatic, or substituted or unsubstituted, divalent aromatic hydrocarbon group;
R$^2$ is a hydrogen atom, a substituted or unsubstituted alkyl, alkenyl, aralkyl, aryl, alkoxy or aryloxy;
R$^3$, R$^4$ and R$^5$ are the same or different and each represents a single bond, a substituted or unsubstituted, divalent, aliphatic or aromatic hydrocarbon group wherein two or three of R$^2$, R$^3$, R$^4$ and R$^5$ may form part of a ring; and
Ar is a substituted or unsubstituted, trivalent, aromatic hydrocarbon group.

10. A photosensitive lithographic printing plate according to claim 9, wherein said diol compound further comprises a diol selected from the group consisting of ethylene glycol; diethylene glycol; triethylene glycol; tetraethylene glycol; propylene glycol; dipropylene glycol; polyethylene glycol; polypropylene glycol; neopentyl glycol; 1,3-butylene glycol; 1,4-butane diol; 1,5-pentane diol; 1,6-hexane diol; 2-butene-1,4-diol; 2-butyne-1,4-diol; 2,2,4-trimethyl-1,3-pentane diol; 2,2-diethyl-1,3-propane diol; 1,4-bis-β-hydroxyethoxy cyclohexane; cyclohexane diol; cyclohexane dimethanol; tricyclodecane dimethanol; hydrogenated bisphenol A; 2,2-dimethylol malonic acid diethyl ester; bis(2-hydroxyethyl) sulfide; hydrogenated bisphenol F; the adduct of bisphenol A and ethylene oxide; the adduct of bisphenol A and propylene oxide; the adduct of bisphenol F and ethylene oxide; the adduct of bisphenol F and propylene oxide; the adduct of hydrogenated bisphenol A and ethylene oxide; the adduct of hydrogenated bisphenol A and propylene oxide; hydroquinone dihydroxyethyl ether; p-xylylene glycol; dihydroxyethyl sulphone; bis(2-hydroxyethyl)-2,4-tolylene dicarbamate; 2,4-tolylene-bis(2-hydroxyethyl carbamide), bis(2-hydroxyethyl)-m-xylylene dicarbamate; and bis(2-hydroxyethyl) isophthalate.

11. A photosensitive lithographic printing plate according to claim 9, wherein said diol compound is selected from the group consisting of 2,4-tolylene diisocyanate, 2,4-tolylene diisocyanate dimer, 2,6-tolylene diisocyanate, p-xylylene diisocyanate, m-xylylene diisocyanate, 4,4'-diphenylmethane diisocyanate, 1,5-naphthalene diisocyanate, 3,3'-dimethylbiphenyl-4'4-diisocyanate, hexamethylene diisocyanate, trimethyl hexamethylene diisocyanate, lysine diisocyante, dimer acid diisocyanate, isophorone diisocyanate, 4-4'-methylene bis(cyclohexylioscyanate), methylcyclohexane-2,4 (or 2,6)-diisocyante, 1,3-(isocyanatemethyl) cyclohexane, and the addition product of 1 mole of 1,3-butylene glycol and 2 moles of tolylene diisocyante.

12. A photosensitive lithographic printing plate according to claim 9, wherein the one or more of the diol compounds with carboxyl groups represented by formula (II), (III) or (IV), are at least one selected from the group consisting of 3,5-dihydroxy benzoic acid, 2,2-bis(-hydroxymethyl)propionic acid, 2,2-bis(2-hydroxyethyl)propionic acid, 2,2-bis(3-hyrodxypropyl)propionic acid, bis(hydroxymethyl)acetic acid, bis(4-hydroxyphenyl)acetic acid, 4,4-bis(4-hydroxyphenyl)pentanoic acid, tartaric acid, and N,N-bis(2-hydroxyethyl)-3-carboxy propionamide.

13. A photosensitive lithographic printing plate according to claim 9, wherein an average molecular weight of said resin ranges from 5,000 to 150,000.

14. A printing plate according to claim 1, wherein component (b) is a resin with a backbone formed by reaction of the diisocyanate represented by formula (I) with one or more diol compounds represented by formula (V), (VI), (VII) or (VIII):

OCN—R¹—NCO (I)

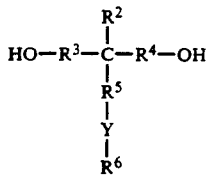 (V)

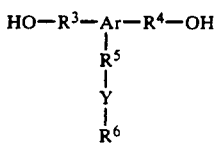 (VI)

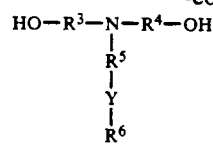 (VII)

HO—R³—Y—R⁴—OH (VIII)

wherein
R¹ is a substituted or unsubstituted, divalent aliphatic, or substituted or unsubstituted, divalent aromatic hydrocarbon group;
R² is a hydrogen atom, a substituted or unsubstituted alkyl, alkenyl, aralkyl, aryl, alkoxy or aryloxy;
R³, R⁴ and R⁵ are the same or different and each represents a single bond, a substituted or unsubstituted, divalent, aliphatic or aromatic hydrocarbon group wherein two or three of R², R³, R⁴ and R⁵ may form part of a ring;
Ar is a substituted or unsubstituted, trivalent, aromatic hydrocarbon group;
R⁶ is a substituted or unsubstituted, monovalent, aliphatic or aromatic hydrocarbon group; and
Y is an N-sulfonylamide group (—CO—NH—SO₂—), an N-sulfonylureide group (—NH—CO——NH—SO₂—), an N-amino sulfonylamide group (—CO—NH—SO₂—NH—) or a sulfonylurethane group (—O—CO—NH—SO₂—).

15. A printing plate according to claim 1, wherein Y is a methyl groups, an ethyl group, an n-propyl group, an isopropyl group, and n-butyl group, an isobutyl group, a tert-butyl group, a sec-butyl group, a hydroxy group, a methoxy group, an ethoxy group, an n-propoxy group, an isopropoxy group, an n-butoxy group, an isobutyoxy group, a tert-butoxy group, a sec-butoxy group, a nitro group, a fluorine atom, a chlorine atom, a bromine atom or an iodine atom.

16. A printing plate according to claim 1, wherein R is a hydrogen atom, a methyl group, an ethyl group, an n-propyl group, an isopropyl group, an n-butyl group, an isobutyl group, a tert-butyl group, a sec-butyl group, a phenyl group, a fluorophenyl group, a chlorophenyl group, a bromophenyl group or a tolyl group.

17. A printing plate according to claim 1, wherein component (c) is phenyl phosphonic acid, methyl phenyl phosphonate, ethyl phenyl phosphonate, propyl phenyl phosphonate, butyl phenyl phosphonate, nitrophenyl phosphonic acid, chlorophenyl phosphonic acid, dichlorophenyl phosphonic acid, tolyl phosphonic acid, phenyl phosphoric acid, methyl phenyl phosphate, benzyl phosphonic acid, phenyl benzyl phosphonate, fluorobenzyl phosphonic acid, chlorobenzyl phosphonic acid, bromobenzyl phosphonic acid, nitrobenzyl phosphonic acid, benzyl phosphate, nitrobenzyl phosphate, chlorobenzyl phosphate, bromobenzyl phosphate or fluorobenzyl phosphate.

18. A printing plate according to claim 1, wherein component (c) is phenyl phosphonic acid or benzyl phosphonic acid.

19. A photosensitive lithographic printing plate according to claim 1, wherein the layer is provided in a coverage of from 0.5 to 5 g/m₂.

* * * * *